United States Patent
Oshima (10) Patent No.: US 7,355,825 B2
(45) Date of Patent: Apr. 8, 2008

(54) CURRENT-PERPENDICULAR-TO-THE-PLANE STRUCTURE MAGNETORESISTIVE ELEMENT AND HEAD SLIDER

(75) Inventor: Hirotaka Oshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 329 days.

(21) Appl. No.: 11/072,571

(22) Filed: Mar. 4, 2005

(65) Prior Publication Data

US 2005/0146813 A1   Jul. 7, 2005

Related U.S. Application Data

(63) Continuation of application No. PCT/JP03/03797, filed on Mar. 27, 2003.

(51) Int. Cl.
*G11B 5/33* (2006.01)
*G11B 5/127* (2006.01)

(52) U.S. Cl. .................. 360/324.12; 360/327.3
(58) Field of Classification Search ........... 360/324.12, 360/327.32, 327.23
See application file for complete search history.

(56) References Cited

U.S. PATENT DOCUMENTS

| | | | | |
|---|---|---|---|---|
| 6,326,092 | B1* | 12/2001 | Ikarashi et al. ............. 428/811 |
| 2002/0163766 | A1* | 11/2002 | Eguchi et al. ......... 360/324.12 |
| 2003/0011940 | A1* | 1/2003 | Tateyama et al. ........... 360/321 |
| 2003/0133234 | A1* | 7/2003 | Furukawa et al. ..... 360/324.12 |
| 2006/0152864 | A1* | 7/2006 | Ohtsu et al. ........... 360/324.12 |

FOREIGN PATENT DOCUMENTS

| | | | |
|---|---|---|---|
| JP | 8-147633 | | 6/1996 |
| JP | 08147633 A | * | 6/1996 |
| JP | 2002-171013 | | 6/2002 |
| JP | 2002-329905 | | 11/2002 |

* cited by examiner

*Primary Examiner*—Brian E. Miller
*Assistant Examiner*—Adam B Dravininkas
(74) *Attorney, Agent, or Firm*—Greer, Burns & Crain, Ltd.

(57) ABSTRACT

A magnetoresistive film is interposed between domain controlling films in a current-perpendicular-to-the-plane (CPP) structure magnetoresistive element. The domain controlling films are designed to establish a first biasing magnetic field of a first intensity across the magnetoresistive film along the front end of the magnetoresistive film and a second biasing magnetic field of a second intensity larger than the first intensity along the rear end of the magnetoresistive film. The second biasing magnetic field serves to establish a single domain property within the magnetoresistive film along the rear end. Although the first biasing magnetic field acts in the same direction as the current field at a position near the front end of the magnetoresistive film, the magnetization is allowed to reliably rotate near the front end. A sensing current having a larger current value can be supplied to the magnetoresistive film. The magnetoresistive film exhibits a sufficient sensitivity.

8 Claims, 10 Drawing Sheets

CURRENT-PERPENDICULAR-TO-THE-PLANE STRUCTURE MAGNETORESISTIVE ELEMENT AND HEAD SLIDER

This is a continuation of International Application No. PCT/JP2003/003797, filed Mar. 27, 2003.

BACKGROUND OF THE INVENTION

1. Field of the Invention

The present invention relates to a magnetoresistive element utilizing a magnetoresistive film such as a spin valve film, a tunnel-junction film, or the like. In particular, the invention relates to a current-perpendicular-to-the-plane (CCP) structure magnetoresistive element allowing a sensing current to have a component perpendicular to the surface of a substratum receiving a magnetoresistive film.

2. Description of the Prior Art

A magnetoresistive film is well known to extend rearward from the front end exposed at the medium-opposed surface or air bearing surface (ABS) by a predetermined length. The magnetoresistive film is interposed between a pair of domain controlling films made of a hard magnetic material. The domain controlling films serve to establish a biasing magnetic field across the magnetoresistive film in a predetermined direction. A single domain property can be realized in the predetermined direction in a free ferromagnetic layer in the magnetoresistive film based on the action of the biasing magnetic field.

The flow of the sensing current induces an annular magnetic field in the free ferromagnetic layer. The sensing current of a larger current value makes the annular magnetic field stronger. A stronger annular magnetic field tends to establish an annular magnetization within the free ferromagnetic layer. This hinders establishment of a single domain property in the free ferromagnetic layer. The influence of Barkhausen noise is supposed to appear in signals from the magnetoresistive film.

On the other hand, a stronger biasing magnetic field can be employed to reliably realize a single domain property in the free ferromagnetic layer even when the current level of the sensing current is set higher. The biasing magnetic field is opposed to some part of the annular magnetic field, so that the biasing magnetic field overcomes the annular magnetic field. However, the biasing magnetic field acts in the same direction as some part of the annular magnetic field. The magnetic field excessively acts in this direction in the free ferromagnetic layer. This hinder the rotation of magnetization in the free ferromagnetic layer. The sensitivity of the magnetoresistive film may be deteriorated.

SUMMARY OF THE INVENTION

It is accordingly an object of the present invention to provide a current-perpendicular-to-the-plane structure magnetoresistive element allowing flow of a sensing current having a higher current level without reducing the sensitivity of the magnetoresistive film.

According to a first aspect of the present invention, there is provided a current-perpendicular-to-the-plane (CPP) structure magnetoresistive element comprising: a magnetoresistive film extending rearward from the front end exposed at a medium-opposed surface; and domain controlling films extending rearward from the front ends exposed at the medium-opposed surface, respectively, said magnetoresistive film interposed between the domain controlling films, wherein the domain controlling films respectively comprise: first regions designed to establish a first biasing magnetic field of a first intensity across the magnetoresistive film along the front end of the magnetoresistive film; and second regions designed to establish a second biasing magnetic field of a second intensity larger than the first intensity across the magnetoresistive film along the rear end of the magnetoresistive film.

The CPP structure magnetoresistive element allows the second biasing magnetic field to get opposed to the current field at a position near the rear end of the magnetoresistive film. The second biasing magnetic field overcomes the current field, so that the single domain property is established within the magnetoresistive film in a direction along the medium-opposed surface. On the other hand, the first biasing magnetic field acts in the same direction as the current field at a position near the front end of the magnetoresistive film. The magnetization is allowed to reliably rotate within the magnetoresistive film in response to the inversion of the magnetic flux acting on the magnetoresistive film from a recording medium. The rotation of the magnetization within the magnetoresistive film induces a large variation in the electric resistance of the magnetoresistive film. This causes variation in the voltage level of a sensing current supplied to the magnetoresistive film. This variation in the voltage level is utilized to discriminate binary data. Specifically, the CPP structure magnetoresistive element enables supply of the sensing current having a larger current value to the magnetoresistive film. Moreover, the magnetoresistive film is allowed to maintain a sufficient sensitivity.

The second regions of the domain controlling films may have a thickness larger than that of the first regions of the domain controlling films. This enables establishment of the second intensity larger than the first intensity based on the second regions.

The first regions may be made of a material of a first composition having a first residual magnetic flux density, while the second regions may be made of a material of a second composition having a second residual magnetic flux density larger than the first residual magnetic flux density. This likewise enables establishment of the second intensity larger than the first intensity based on the second regions.

The CPP structure magnetoresistive element may further comprise: a first underlayer or underlayers receiving the first regions of the domain controlling films, said first underlayer or underlayers designed to control the size of crystal grains in the first regions; and a second underlayer or underlayers receiving the second regions of the domain controlling films, said second underlayer or underlayers designed to control the size of crystal grains in the second regions. The underlayers serve to control the residual magnetic flux density in the first and second regions of the domain controlling films. The second intensity can thus be set larger than the first intensity.

In addition, the rear ends of the domain controlling films may be located at a position backward from the rear end of the magnetoresistive film. This likewise enables establishment of the second intensity larger than the first intensity along the rear end of the magnetoresistive film.

According to a second aspect of the present invention, there is provided a current-perpendicular-to-the-plane (CPP) structure magnetoresistive element comprising: a magnetoresistive film extending rearward from the front end exposed at a medium-opposed surface; and domain controlling films extending rearward from the front ends exposed at the medium-opposed surface, respectively, said magnetoresistive film interposed between the domain controlling films, wherein said domain controlling films respectively comprise: first regions designed to establish a first biasing magnetic field of a first intensity across the magnetoresistive film along the front end of the magnetoresistive film; and second regions designed to establish a second biasing magnetic field of a second intensity smaller than the first intensity across the magnetoresistive film along the rear end of the magnetoresistive film.

The CPP structure magnetoresistive element allows the first biasing magnetic field to get opposed to the current field at a position near the front end of the magnetoresistive film. The first biasing magnetic field overcomes the current field, so that the single domain property is established within the magnetoresistive film in a direction along the medium-opposed surface. On the other hand, the second biasing magnetic field acts in the same direction as the current field at a position near the rear end of the magnetoresistive film. The magnetization is allowed to reliably rotate within the magnetoresistive film in response to the inversion of the magnetic flux acting on the magnetoresistive film from a recording medium. The rotation of the magnetization within the magnetoresistive film induces a large variation in the electric resistance of the magnetoresistive film. This causes variation in the voltage level of a sensing current supplied to the magnetoresistive film. This variation in the voltage level is utilized to discriminate binary data. Specifically, the CPP structure magnetoresistive element enables supply of the sensing current having a larger current value to the magnetoresistive film. Moreover, the magnetoresistive film is allowed to maintain a sufficient sensitivity.

The second regions of the domain controlling films may have a thickness smaller than that of the first regions of the domain controlling films. Otherwise, the first regions may be made of a material of a first composition having a first residual magnetic flux density, while the second regions may be made of a material of a second composition having a second residual magnetic flux density larger than the first residual magnetic flux density. Furthermore, the CPP structure magnetoresistive element may further comprise: a first underlayer or underlayers receiving the first regions of the domain controlling films, said first underlayer or underlayers designed to control the size of crystal grains in the first regions; and a second underlayer or underlayers receiving the second regions of the domain controlling films, said second underlayer or underlayers designed to control the size of crystal grains in the second regions.

The aforementioned current-perpendicular-to-the-plane structure magnetoresistive element may be mounted on a head slider in general utilized in a magnetic recording medium drive such as a hard disk drive, for example.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
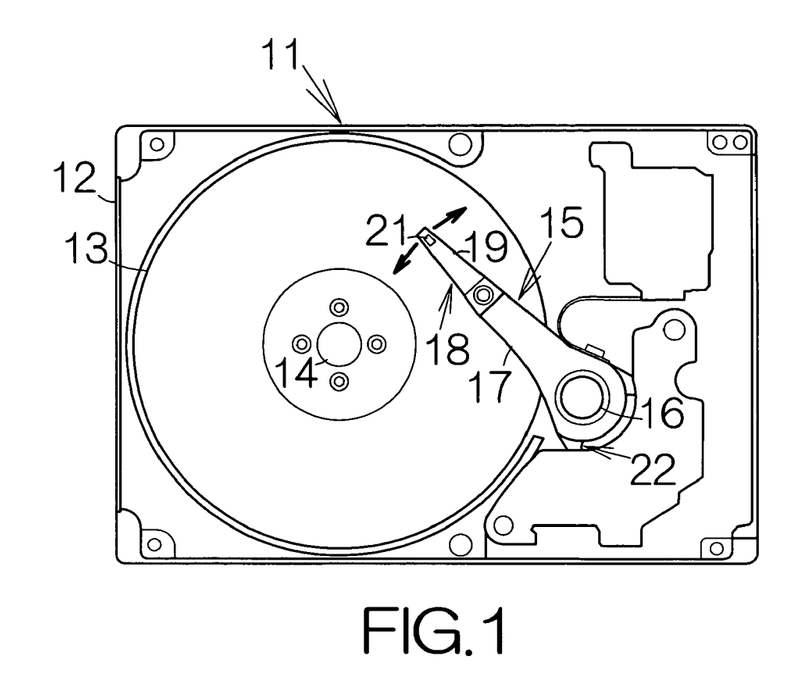
FIG. 1 is a plan view schematically illustrating the structure of a hard disk drive (HDD) as a specific example of a magnetic recording medium drive.

FIG. 1 schematically illustrates the inner structure of a hard disk drive (HDD) 11 as an example of a magnetic recording device or storage system. The HDD 11 includes a box-shaped main enclosure 12 defining an inner space of a flat parallelepiped, for example. At least one magnetic recording disk 13 as a recording medium is incorporated in the inner space within the main enclosure 12. The magnetic recording disk or disks 13 is mounted on the driving shaft of a spindle motor 14. The spindle motor 14 is allowed to drive the magnetic recording disk or disks 13 for rotation at a higher revolution speed such as 7,200 rpm, 10,000 rpm, or the like. A cover, not shown, is coupled to the main enclosure 12 so as to define the closed inner space between the main enclosure 12 and itself.

A head actuator 15 is also incorporated within the inner space of the main enclosure 12. The head actuator 15 is coupled to a vertical support shaft 16 for relative rotation. The head actuator 15 includes rigid actuator arms 17 extending from the vertical support shaft 16 in the horizontal direction. A head suspension assembly 18 is attached to the tip or front end of the individual actuator arm 17. The head suspension assembly 18 extends forward from the front end of the actuator arm 17. The actuator arms 17 are related to the front and back surfaces of the magnetic recording disk 13.

The head suspension assembly 18 include a load beam 19. The load beam 19 is connected to the front end of the actuator arm 17 through a so-called elastic deformable portion. The elastic deformable portion serves to urge the front end of the load beam 19 toward the surface of the magnetic recording disk 13. A flying head slider 21 is supported at the front end of the load beam 19. The flying head slider 21 is received on a gimbal, not shown, fixed to the load beam 19, so that the flying head slider 21 can change its attitude.

When the magnetic recording disk 13 rotates, the flying head slider 21 is allowed to receive airflow generated along the rotating magnetic recording disk 13. The airflow serves to generate a lift or positive pressure and a negative pressure on the flying head slider 21, as described later. The flying head slider 21 is thus allowed to keep flying above the surface of the magnetic recording disk 13 during the rotation of the magnetic recording disk 13 at a higher stability established by the balance between the urging force of the head suspension 19 and a combination of the lift and the negative pressure.

A power source 22 such as a voice coil motor (VCM) is connected to the actuator arms 17. The power source 22 drives the actuator arms 17 for rotation around the support shaft 16. The rotation of the actuator arms 17 induces the movement of the head suspension assemblies 19. When the actuator arm 17 is driven to swing about the support shaft 16 during the flight of the flying head slider 21, the flying head slider 21 is allowed to cross the recording tracks defined on the magnetic recording disk 13 in the radial direction of the magnetic recording disk 13. This radial movement serves to position the flying head slider 21 right above a target recording track on the magnetic recording disk 13.

Figure 2:
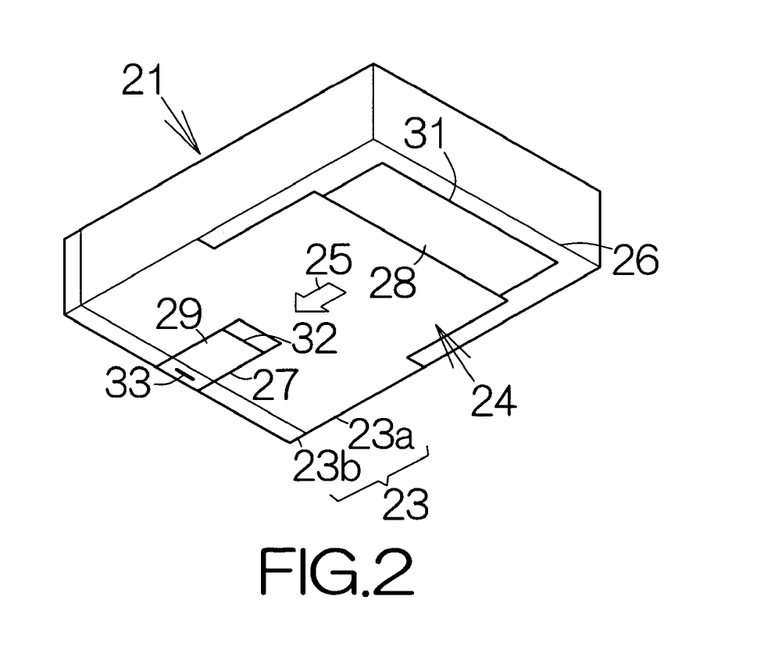
FIG. 2 is an enlarged perspective view schematically illustrating the structure of a flying head slider according to a specific example.

FIG. 2 illustrates a specific example of the flying head slider 21. The flying head slider 21 includes a slider body 23 in the form of a flat parallelepiped. The slider body 23 defines a medium-opposed surface or bottom surface 24 opposed to the magnetic recording disk 13. A flat base or reference surface is defined in the bottom surface 24. When the magnetic recording disk 13 rotates, airflow 25 runs along the bottom surface 24 from the front or leading end to the rear or trailing end of the slider body 23. The slider body 23 may include a base 23a made of $Al_2O_3$—TiC, and a head protection film 23b made of $Al_2O_3$ covering over the front or leading end surface of the base 23a.

A front rail 26 and a rear rail 27 are formed on the bottom surface 24 of the slider body 23. The front rail 26 is designed to extend on the base surface near the leading or inflow end of the slider body 23. The rear rail 27 is located near the trailing or outflow end of the slider body 23. Air bearing surfaces (ABSs) 28, 29 are respectively defined on the top surfaces of the front and rear rails 26, 27. The inflow ends of the air bearing surfaces 28, 29 are connected to the top surfaces of the front and rear rails 26, 27 through steps 31, 32, respectively.

The airflow 25 generated along the surface of the rotating magnetic recording disk 13 is received at the bottom surface 24. The steps 31, 32 serve to generate a larger lift or positive pressure at the air bearing surfaces 28, 29. A larger negative pressure is generated behind the front rail 26. A combination of the lift and the negative pressure serves to stabilize the attitude of the flying head slider 21.

A read/write electromagnetic transducer 33 is mounted on the slider body 23. The read/write electromagnetic transducer 33 is embedded in the head protection film 23b of the slider body 23. The read/write electromagnetic transducer 33 exposes the read gap and the write gap at the air bearing surface 29 on the rear rail 27. It should be noted that the front end of the read/write electromagnetic transducer 33 may be covered with a protection layer, made of diamond-like-carbon (DLC), extending over the air bearing surface 29. The read/write electromagnetic transducer 33 will be described later in detail. The flying head slider 21 may take any shape or form other than the aforementioned one.

Figure 3:
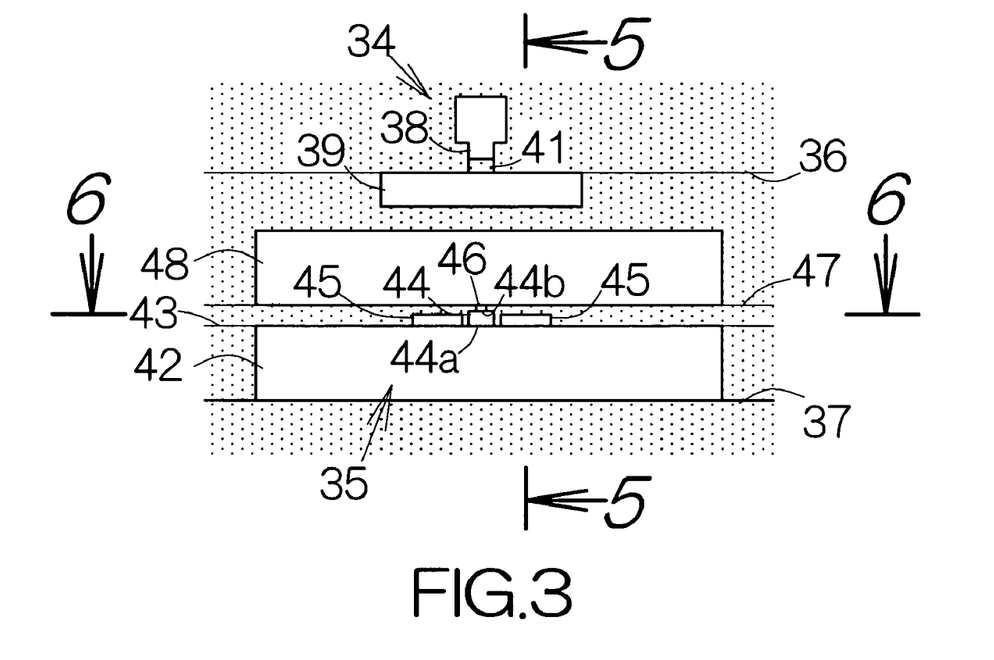
FIG. 3 is a front view schematically illustrating a read/write electromagnetic transducer exposed at the bottom surface of the flying head slider.

FIG. 3, illustrates an enlarged partial view of the bottom surface 24. The read/write electromagnetic transducer 33 includes a thin film magnetic head 34 such as an inductive magnetic write head and a current-perpendicular-to-the-plane (CPP) structure electromagnetic transducer element such as a CPP structure magnetoresistive read element 35. The thin film magnetic head 34 is designed to write a magnetic bit data onto the magnetic recording disk 13 by utilizing a magnetic field induced at a conductive swirly coil pattern, not shown, for example. The CPP structure magnetoresistive read element 35 is designed to detect a magnetic bit data by utilizing variation of the electric resistance in response to the inversion of the magnetic polarity in a magnetic field acting from the magnetic recording disk 13.

The thin film magnetic head 34 and the CPP structure magnetoresistive read element 35 are interposed between an Al$_2$O$_3$ (alumina) layer 36 as an upper half of the head protection film 23b or overcoat film and an Al$_2$O$_3$ (alumina) layer 37 as a lower half of the head protection film 23b or undercoat film.

The thin film magnetic head 34 includes an upper magnetic pole layer 38 exposing the front end at the air bearing surface 29, and a lower magnetic pole layer 39 likewise exposing the front end at the air bearing surface 29. The upper and lower magnetic pole layers 38, 39 may be made of FeN, NiFe, or the like, for example. The combination of the upper and lower magnetic pole layers 38, 39 establishes the magnetic core of the thin film magnetic head 34.

A non-magnetic gap layer 41 is interposed between the upper and lower magnetic pole layers 38, 39. The non-magnetic gap layer 41 may be made of Al$_2$O$_3$ (alumina), for example. When a magnetic field is induced at the conductive swirly coil pattern, a magnetic flux is exchanged between the upper and lower magnetic pole layers 38, 39. The non-magnetic gap layer 41 allows the exchanged magnetic flux to leak out of the bottom surface 24. The thus leaked magnetic flux forms a magnetic field for recordation, namely, a write gap magnetic field.

The CPP structure magnetoresistive read element 35 includes a lower electrode 42 spreading over the upper surface of the alumina layer 37 as a basement insulation layer. The lower electrode 42 may have not only a property of electric conductors but also a soft magnetic property. If the lower electrode 42 is made of a soft magnetic electric conductor, such as NiFe, for example, the lower electrode 42 is also allowed to serve as a lower shielding layer for the CPP structure magnetoresistive read element 35.

A flattened surface 43 is defined on the upper surface of the lower electrode 42. An electromagnetic transducer film or magnetoresistive (MR) film 44 is overlaid on the flattened surface 43. The magnetoresistive film 44 extends rearward from the tip or front end exposed at the air bearing surface 29 along the upper surface of the lower electrode 42. The lower electrode 42 contacts with the lower boundary 44a of the magnetoresistive film 44 at least at the front end exposed at the air bearing surface 29. Electrical connection is thus established between the magnetoresistive film 44 and the lower electrode 42. The structure of the magnetoresistive film 44 will be described later in detail.

Likewise, a pair of domain controlling films 45 made of a hard magnetic material are overlaid on the flattened surface 43. The domain controlling films 45 are allowed to extend along the air bearing surface 29. The magnetoresistive film 44 is interposed between the domain controlling films 45 on the flattened surface 43 along the air bearing surface 29. The domain controlling films 45 may be made of a metallic material such as CoPt, CoCrPt, or the like. The domain controlling films 45 serve to establish a biasing magnetic field across the magnetoresistive film 44 in parallel with the air bearing surface 29. When a biasing magnetic field is established based on the magnetization in the domain controlling films 45, the orientation of the magnetization can be controlled in a free magnetic layer within the magnetoresistive film 44. The structure of the domain controlling films 45 will be described later in detail.

An upper terminal piece 46 is formed on the upper boundary 44b of the magnetoresistive film 44. The upper terminal piece 46 is embedded in an overlaid insulation layer 47 extending on the flattened surface 43. The overlaid insulation layer 47 covers over the domain controlling films 45 on the lower electrode 42. The overlaid insulation layer 47 gets exposed from the overlaid insulation layer 47 at a position adjacent the air bearing surface 29.

An upper electrode 48 is overlaid on the surfaces of the upper terminal piece 46 and the overlaid insulation layer 47. The upper electrode 48 is allowed to contact with the upper terminal piece 46 at least at the front end exposed at the air bearing surface 29. Electric connection is thus established between the magnetoresistive film 44 and the upper electrode 48. If the upper electrode 48 is made of a soft magnetic electric conductor, such as NiFe, for example, the upper electrode 48 is also allowed to serve as an upper shielding layer for the CPP structure magnetoresistive read element 35.

Figure 4:
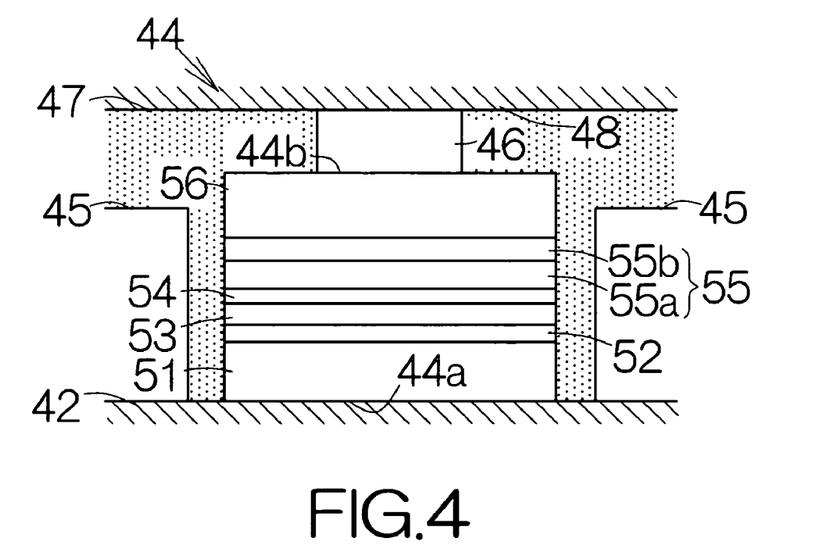
FIG. 4 is an enlarged front view schematically illustrating the structure of a current-perpendicular-to-the-plane (CPP) structure magnetoresistive read element.

FIG. 4 illustrates an example of the magnetoresistive film 44. The magnetoresistive film 44 is structured as a spin valve film. Specifically, the magnetoresistive film 44 includes a Ta basement layer 51, a pinning layer such as an antiferromagnetic layer 52, a pinned magnetic layer 53, an electrically-conductive intermediate layer 54, a free magnetic layer 55 and an electrically-conductive cap layer 56 layered in this sequence. The antiferromagnetic layer 52 serves to fix the magnetization in a predetermined direction in the pinned magnetic layer 53. Here, the antiferromagnetic layer 52 may be made of an antiferromagnetic alloy material such as IrMn, PdPtMn, or the like. The pinned magnetic layer 53 may be made of a ferromagnetic material such as CoFe, for example. The intermediate layer 54 may be made of a Cu layer, for example. The free magnetic layer 55 may be made of a multilayered material including a NiFe layer 55a overlaid on the surface of the intermediate layer 54 and a CoFe layer 55b overlaid on the surface of the NiFe layer 55a. The cap layer 56 may be made of a Au layer, a Pt layer, or the like.

Alternatively, a tunnel-junction film may be employed as the magnetoresistive film 44. The tunnel-junction film includes an intermediate insulating layer interposed between the pinned magnetic layer 53 and the free magnetic layer 55 in place of the aforementioned electrically-conductive intermediate layer 54. The intermediate insulating layer may be made of an Al$_2$O$_3$ layer, for example.

Figure 5:
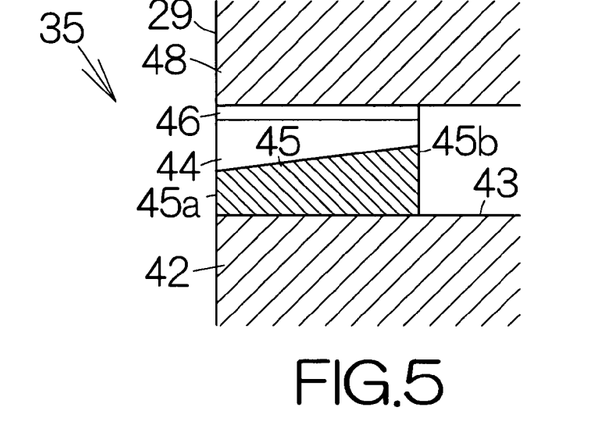
FIG. 5 is an enlarged partial sectional view taken along the line 5-5 in FIG. 3.

FIG. 5, schematically illustrates the structure of a CPP structure magnetoresistive (MR) read element 35 according to a first embodiment of the present invention. The CPP structure magnetoresistive read element 35 allows establishment of first and second regions 45a, 45b in the domain controlling films 45, respectively. The second region 45b is set thicker than the first region 45a. Here, the thickness of the domain controlling films 45 may gradually increase from the front end to the rear end, for example. Specifically, an inclined surface having an inclination angle to the flattened surface 43 may be defined over the surfaces of the domain controlling films 45.

Figure 6:
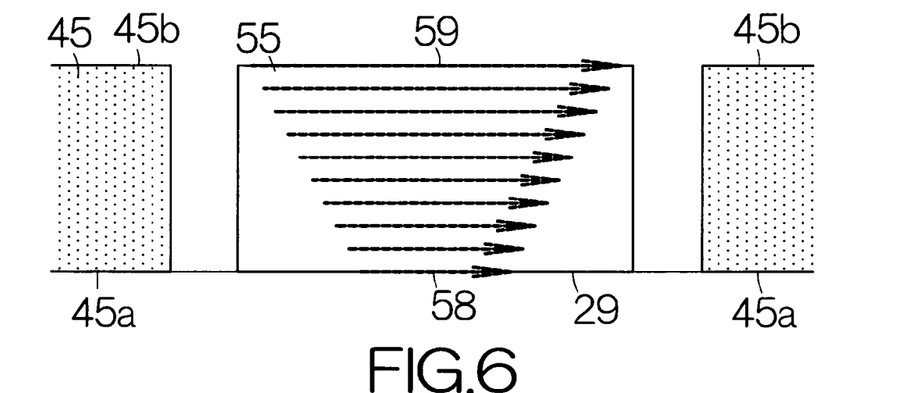
FIG. 6 is an enlarged partial horizontal sectional view taken along the line 6-6 in FIG. 3.

As shown in FIG. 6, the first region 45a induces establishment of a first biasing magnetic field 58 having a first intensity of magnetic flux across the magnetoresistive film 44 along the front end of the magnetoresistive film 44. The second region 45b induces establishment of a second biasing magnetic field 59 having a second intensity of magnetic flux across the magnetoresistive film 44 along the rear end of the magnetoresistive film 44. Here, the second intensity is set larger than the first intensity. The intensity of magnetic flux at a location between the first and second regions 45a, 45b may be set at a level between the first and second intensity for the biasing magnetic field.

Figure 7:
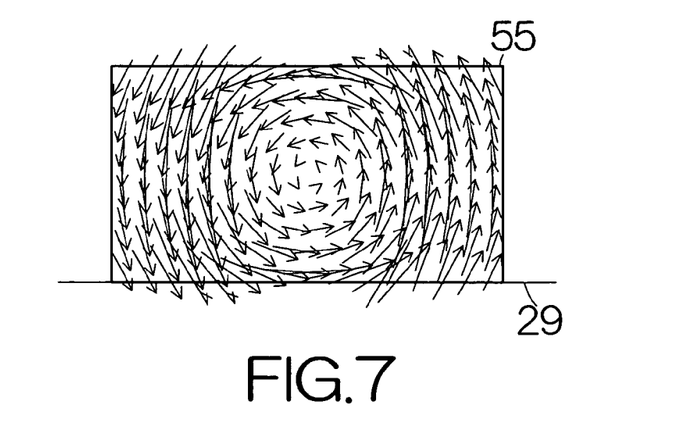
FIG. 7 is a schematic view schematically illustrating the direction of the magnetization induced based on a sensing current in a free magnetic layer.

Now, assume that a sensing current flows through the magnetoresistive film 44. When the sensing current is supplied to the magnetoresistive film 44 from the lower electrode 44, an annular magnetic field, namely a current field is induced in the free magnetic layer 55. The current field circulates within a horizontal plane perpendicular to the flow of the sensing current around the centerline of the flow. The current field exhibits a stronger magnetic field at a remoter location from the centerline of the flow within the horizontal plane. In addition, the larger the current value of the sensing current gets, the stronger the current field becomes.

Figure 8:
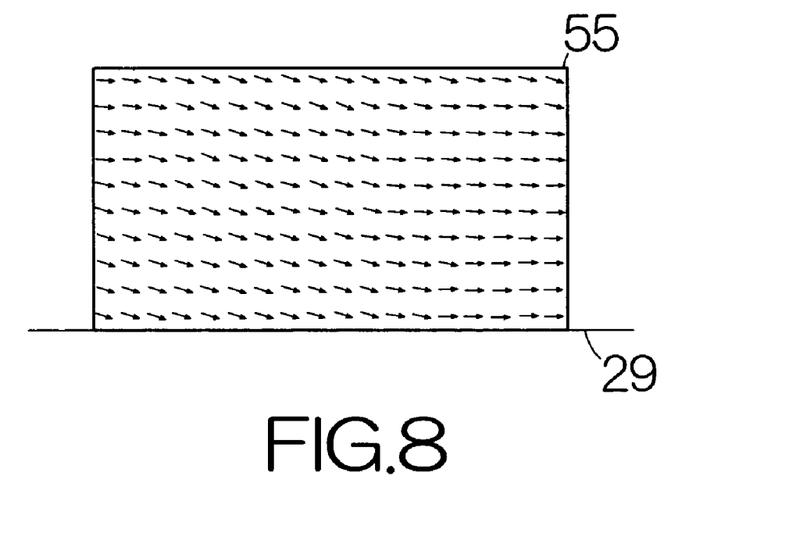
FIG. 8 is a schematic view illustrating the direction of the magnetization controlled based on a biasing magnetic field in the free magnetic layer.

In this case, the second biasing magnetic field 59 is opposed to the current field at a position near the rear end of the free magnetic layer 55. The second biasing magnetic field 59 overcomes the current field, so that the single domain property is established within the free magnetic layer 55 in a direction along the air bearing surface 29, as shown in FIG. 8. On the other hand, the first biasing magnetic field 58 acts in the same direction as the current field at a position near the front end. The magnetization is allowed to reliably rotate within the free magnetic layer 55 in response to the inversion of the magnetic flux acting on the magnetoresistive film 44 from the magnetic recording disk 13. The rotation of the magnetization within the free magnetic layer 55 induces variation in the electric resistance of the magnetoresistive film 44. This causes variation in the voltage level of the sensing current supplied from the lower electrode 42 to the magnetoresistive film 44. This variation in the voltage level is utilized to discriminate binary data. Specifically, the CPP structure magnetoresistive read element 35 enables supply of the sensing current having a larger current value to the magnetoresistive film 44. Moreover, the magnetoresistive film 44 is allowed to maintain a sufficient sensitivity.

Next, a brief description will be made on a method of making the CPP structure magnetoresistive read element 35. A magnetic film of a uniform thickness is formed on the surface of the lower electrode 42, namely on the flattened surface 43. The magnetic film is then subjected to ion milling utilizing a focused ion beam (FIB). Scanning of the focused ion beam serves to form an inclined surface on the magnetic film. The amount of irradiation is controlled to shape the inclined surface during the ion milling, for example. The domain controlling films 45 are thus formed on the lower electrode 42.

Figure 9:
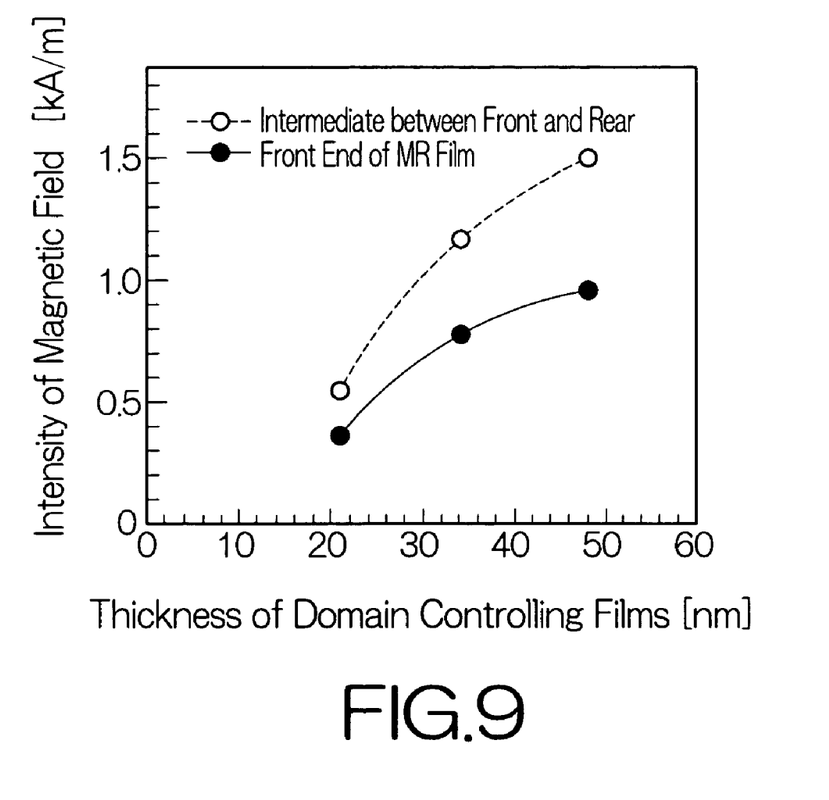
FIG. 9 is a graph showing the relationship between the thickness of domain controlling films and the intensity of the biasing magnetic field.

The inventors have examined the relationship between the thickness of domain controlling films and the intensity of a biasing magnetic field. The inventors utilized a measurement simulation software for magnetic field implemented on a computer. The thickness of the domain controlling films was set at a constant value in a range between 20 nm and 50 nm. The intensity of the biasing magnetic field was calculated at the front end of the magnetoresistive film and an intermediate position between the front and rear ends of the magnetoresistive film. As shown in FIG. 9, as the thickness of the domain controlling films get larger, the biasing magnetic field becomes stronger. A stronger biasing magnetic field has been established at the intermediate position rather than the front end of the magnetoresistive film.

Figure 10:
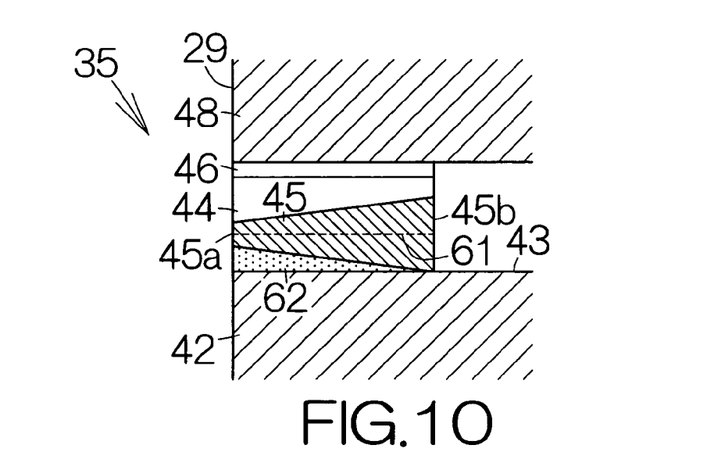
FIG. 10 is an enlarged partial sectional view, corresponding to FIG. 5, for illustrating a portion of a CPP structure magnetoresistive read element according to a modified first embodiment.

As shown in FIG. 10, the domain controlling films 45 may have a form symmetric relative to a datum plane 61 extending in parallel with the flattened surface 43 in the CPP structure magnetoresistive read element 35, for example. The domain controlling films 45 may be received on a non-magnetic layer 62 extending on the flattened surface 43. An inclined surface may be established on the upper surface of the non-magnetic layer 62. The inclined surface may get closer to the flattened surface 43 at a location remoter from the air bearing surface 29.

The domain controlling films 45 in general establish a biasing magnetic field having a distribution of intensity in a plane in parallel to the air bearing surface 29. The distribution exhibits the maximum intensity at the central position of the distribution. Since the domain controlling films 45 are formed symmetric relative to the datum plane 61, the central position of the distribution can be set on the datum plane 61. The biasing magnetic field is allowed to exhibit the maximum intensity at the datum plane 61. If the free magnetic layer 55 of the magnetoresistive film 44 is aligned on the datum plane 61, the free magnetic layer 55 is allowed to enjoy the maximum intensity of the biasing magnetic field.

A non-magnetic film of a uniform thickness is formed on the flattened surface 43 of the lower electrode 42 in a method of making the CPP structure magnetoresistive read element 35 in this case, for example. The upper surface of the non-magnetic film is then subjected to ion milling utilizing a focused ion beam in the aforementioned manner. The inclined surface can thus be established on the upper surface of the non-magnetic layer 62. A magnetic film of a uniform thickness is subsequently formed on the non-magnetic layer 62. The ion milling utilizing the focused ion beam is effected on the upper surface of the magnetic film in the same manner as described above so as to establish the inclined surface on the magnetic film. The domain controlling films 45 are in this manner formed on the lower electrode 42.

Figure 11:
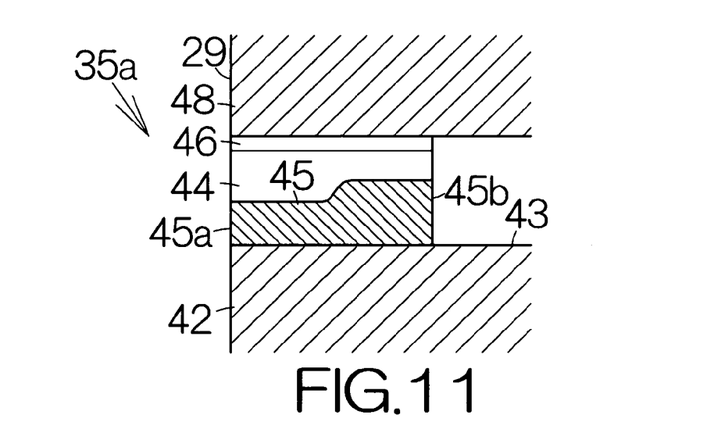
FIG. 11 is an enlarged partial sectional view, corresponding to FIG. 5, for illustrating a portion of a CPP structure magnetoresistive read element according to a second embodiment of the present invention.

FIG. 11 schematically illustrates the structure of a CPP structure magnetoresistive read element 35a according to a second embodiment of the present invention. The CPP structure magnetoresistive read element 35a allows establishment of first and second regions 45a, 45b in the domain controlling films 45. The first region 45a has a first thickness while the second region 45b has a second thickness larger than the first thickness. A step may be defined between the upper surfaces of the first and second regions 45a, 45b. The CPP structure magnetoresistive read element 35a allows establishment of the first biasing magnetic field 58 of the first intensity along the front end of the magnetoresistive film 44. The second biasing magnetic field 59 of the second intensity larger than the first intensity is established near the rear end of the magnetoresistive film 44.

A magnetic film of a uniform thickness is formed on the flattened surface 43 of the lower electrode 42 in a method of making the CPP structure magnetoresistive read element 35a. A resist film is formed on the surface of the magnetic film. The resist film defines a void corresponding to the shape of the first region 45a. When the magnetic film is subjected to etching process, the magnetic film is removed within the void. The first region 45a is in this manner formed. The resist film is thereafter removed. Alternatively, ion milling utilizing a focused ion beam may be employed to form the first region 45a.

Figure 12:
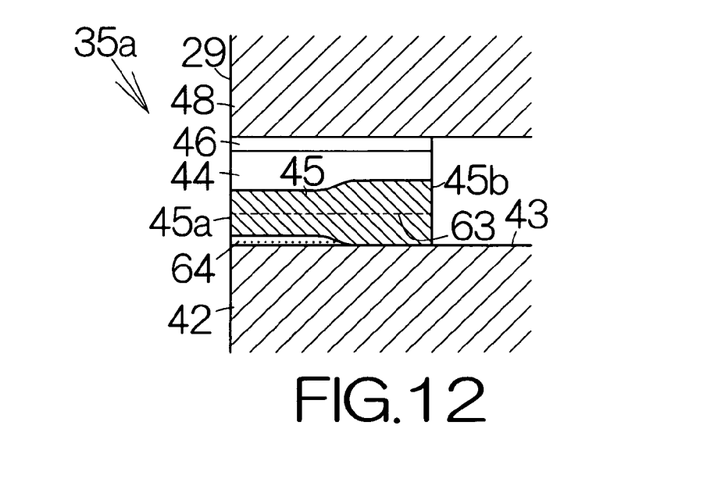
FIG. 12 is an enlarged partial sectional view, corresponding to FIG. 5, for illustrating a portion of a CPP structure magnetoresistive read element according to a modified second embodiment.

As shown in FIG. 12, the CPP structure magnetoresistive read element 35a may allow formation of the domain controlling films 45 symmetric relative to a plane 63 extending in parallel with the flattened surface 43. Here, the first region 45a may be received on a non-magnetic layer 64 extending on the flattened surface 43. The second region 45b may be received on the flattened surface 43. If the free magnetic layer 55 of the magnetoresistive film 44 is located on the plane 63, the free magnetic layer 55 is allowed to receive the biasing magnetic field of the maximum intensity.

Sputtering utilizing a resist film may be employed in a method of making the CPP structure magnetoresistive read element 35a. A resist film is first formed on the lower electrode 42. A void corresponding to the shape of the non-magnetic layer 64 is formed in the resist film. The non-magnetic layer 64 is formed within the void. The resist film is subsequently removed. A magnetic film of a uniform thickness is formed on the non-magnetic film 63 and the lower electrode 42. The magnetic film may subsequently be subjected to etching process based on the resist film in the same manner as described above.

Figure 13:
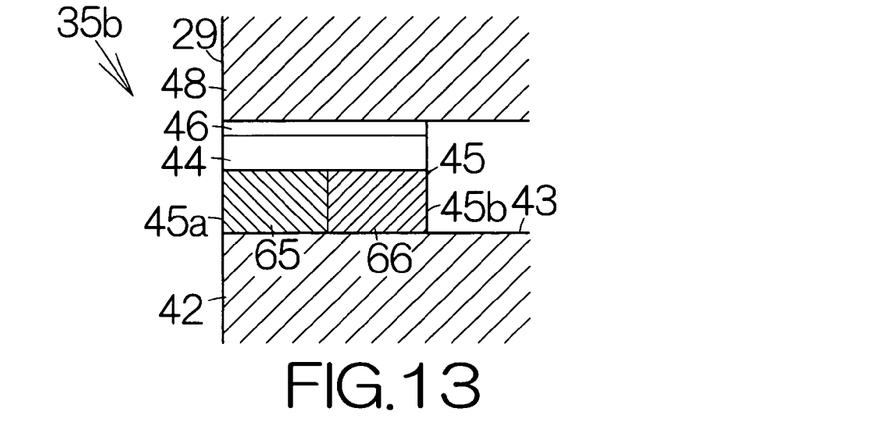
FIG. 13 is an enlarged partial sectional view, corresponding to FIG. 5, for illustrating a portion of a CPP structure magnetoresistive read element according to a third embodiment of the present invention.

FIG. 13 schematically illustrates the structure of a CPP structure magnetoresistive read element 35b according to a third embodiment of the present invention. The CPP structure magnetoresistive read element 35b include a front film 65 extending rearward from the air bearing surface 29 and a rear film 66 extending rearward from the rear end of the front film 65. The front film 65 is made of a material of a first composition having a first residual magnetic flux density. The front film 65 corresponds to the first region 45a. The rear film 66 is made of a material of a second composition having a second residual magnetic flux density larger than the first residual magnetic flux density. The rear film 66 corresponds to the second region 45b. The material of the first and second composition may be a magnetic material including at least one element from a group consisting of Fe, Ni and Co. Here, the domain controlling films 45 have a uniform thickness. Since the first region 45a is made of the material of the first composition having the first residual magnetic flux density, the first biasing magnetic field 58 of the first intensity is established along the front end of the magnetoresistive film 44 in the aforementioned manner. Since the second region 45b is made of the material of the second composition having the second residual magnetic flux density, the second biasing magnetic field 59 of the second intensity larger than the first intensity is established along the rear end of the magnetoresistive film 44.

Sputtering utilizing a resist film may be employed in a method of making the CPP structure magnetoresistive read element 35b. A resist film is first formed on the lower electrode 42. A void corresponding to the shape of the front film 65 is formed in the resist film. The front film 65 is then formed in the void. The resist film is subsequently removed. A resist film is formed on the front film 65. A void corresponding to the shape of the rear film 66 is formed in the resist film. The rear film 66 is then formed in the void. The resist film is subsequently removed. The domain controlling films 45 are in this manner allowed to include the first and second regions 45a, 45b.

Figure 14:
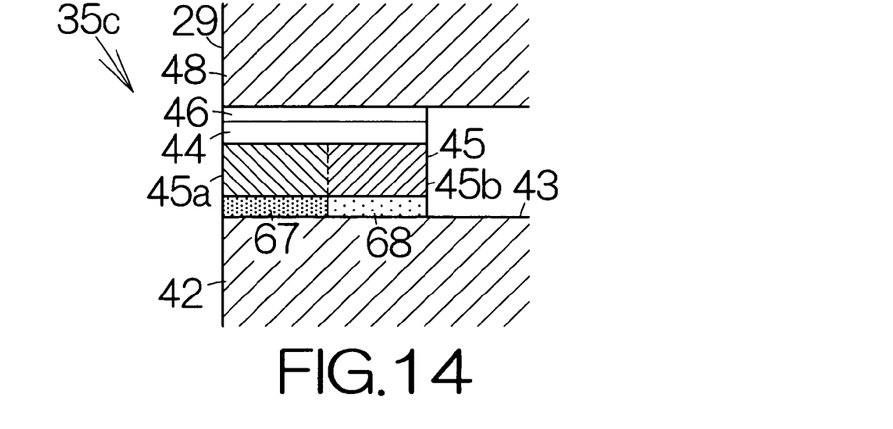
FIG. 14 is an enlarged partial sectional view, corresponding to FIG. 5, for illustrating a portion of a CPP structure magnetoresistive read element according to a fourth embodiment of the present invention.

FIG. 14 schematically illustrates the structure of a CPP structure magnetoresistive read element 35c according to a fourth embodiment of the present invention. The CPP structure magnetoresistive read element 35c includes a first underlayer 67 receiving the first region 45a and a second underlayer 68 receiving the second region 45b. The first and second underlayers 67, 68 may be a Cr layer, a TaCr layer, or the like. The first underlayer 67 serves to control the size and orientation of the crystal grains in the first region 45a. The intensity of the residual magnetic flux density can be controlled in the first region 45a based on the influence from the first underlayer 67. Likewise, the second underlayer 68 serves to control the size and orientation of the crystal grains in the second region 45b. The intensity of the residual magnetic flux density can be controlled in the second region 45b based on the influence from the second underlayer 68. It should be noted that the size of the crystal grains in the second region 45b is set smaller than that of the crystal grains in the first region 45a. The first biasing magnetic field 58 of the first intensity is thus established along the front end of the magnetoresistive film 44. The second biasing magnetic field 59 of the second intensity larger than the first intensity is established along the rear end of the magnetoresistive film 44.

The first and second underlayers 67, 68 may be formed based on resist films in a method of making the CPP magnetoresistive read element 35c, for example. A magnetic film is then formed on the first and second underlayers 67, 68. Sputtering may be utilized to form the magnetic film, for example. Crystal grains grow in the magnetic film based on the epitaxy from the crystal grains in the first and second underlayers 67, 68. The residual magnetic flux density depends on the size of the crystal grains in the magnetic film. Different residual magnetic flux density can be established in the first and second regions 45a, 45b. The domain controlling films 45 are in this manner formed.

Figure 15:
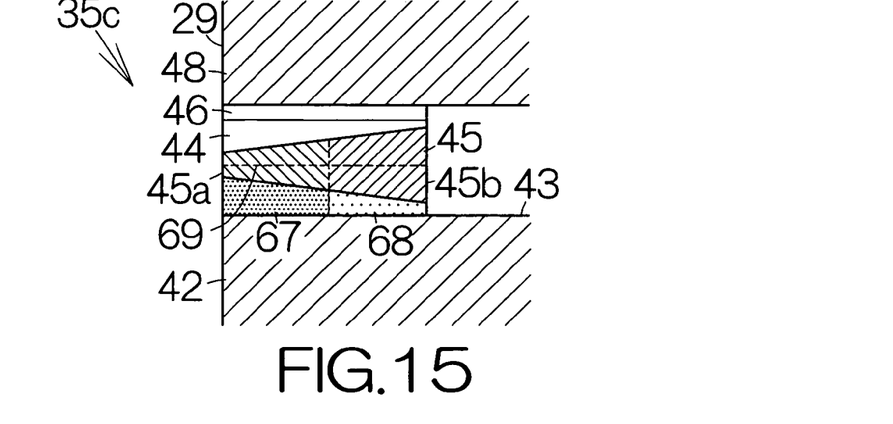
FIG. 15 is an enlarged partial sectional view, corresponding to FIG. 5, for illustrating a portion of a CPP structure magnetoresistive read element according to a modified fourth embodiment.

As shown in FIG. 15, the CPP structure magnetoresistive read element 35c may allow formation of the domain controlling films 45 symmetric relative to a plane 69 extending in parallel with the flattened surface 43, for example. The domain controlling films 45 of the type may be received on the first and second underlayers 67, 68, respectively, in the aforementioned manner. Inclined surfaces may be formed on the first and second underlayers 67, 68, so that the inclined surfaces get closer to the flattened surface 43 at a position remoter from the air bearing surface 29. If the free magnetic layer 55 of the magnetoresistive film 44 is located on the plane 69, the free magnetic layer 55 is allowed to receive the biasing magnetic field of the maximum intensity.

The first and second underlayers 67, 68 are formed based on resist films in a method of making the CPP structure magnetoresistive read element 35c in the same manner as described above. The first and second underlayers 67, 68 are then subjected to ion milling utilizing a focused ion beam. Inclined surfaces are thus formed on the first and second underlayers 67, 68 so as to incline relative to the flattened surface 43. A magnetic film is formed on the surface of the first and second underlayers 67, 68. Sputtering may be employed to form the magnetic film in a conventional manner. Crystal grains grow in the magnetic film based on the epitaxy from the crystal grains in the first and second underlayers 67, 68. The magnetic film is subsequently subjected to ion milling utilizing a focused ion beam in the same manner as described above. The domain controlling films 45 are in this manner formed.

Figure 16:
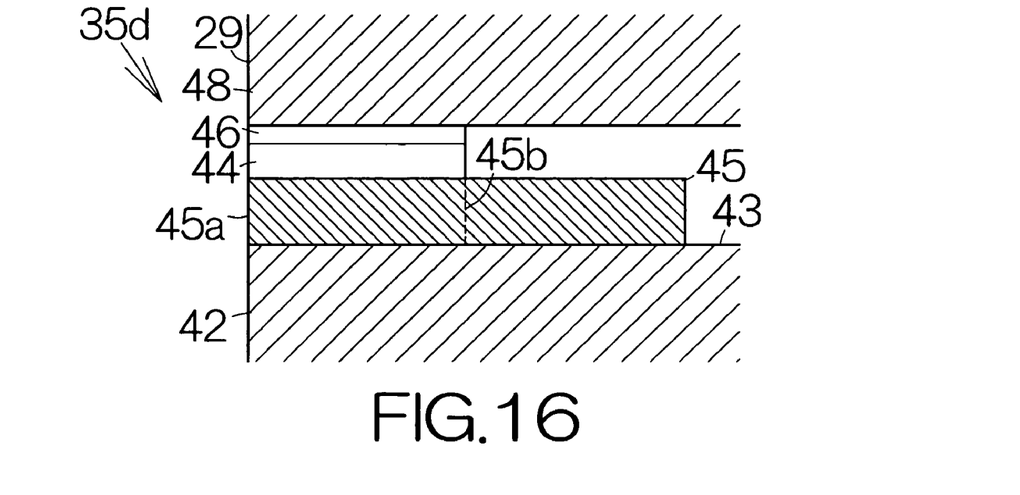
FIG. 16 is an enlarged partial sectional view, corresponding to FIG. 5, for illustrating a portion of a CPP structure magnetoresistive read element according to a fifth embodiment of the present invention.
Figure 17:
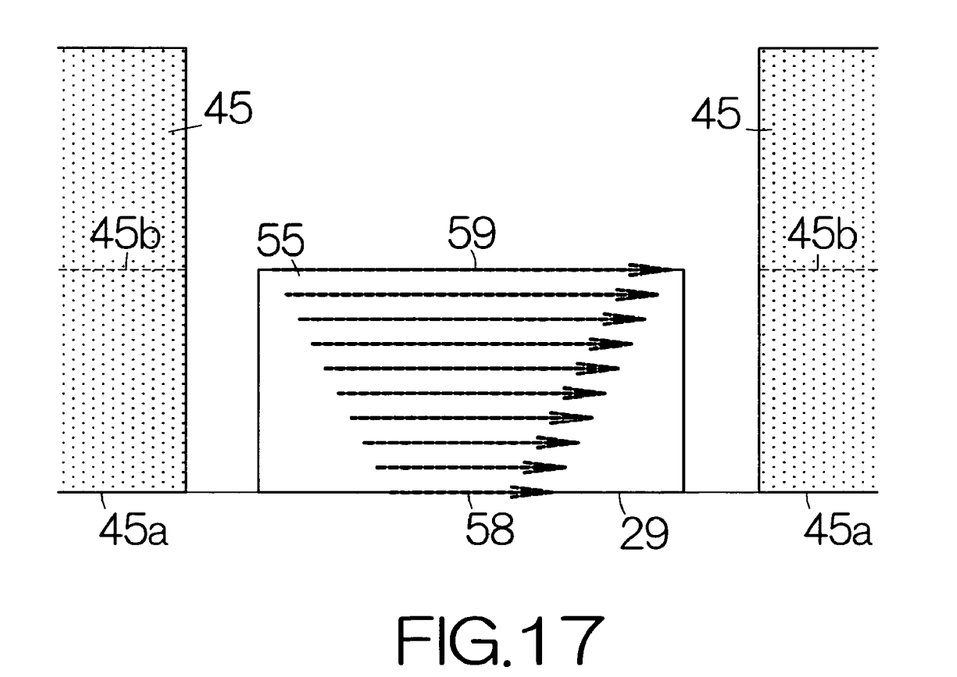
FIG. 17 is an enlarged partial sectional view, corresponding to FIG. 6, for illustrating a portion of the CPP structure magnetoresistive read element according to the fifth embodiment.

FIG. 16 schematically illustrates the structure of a CPP structure magnetoresistive read element 35d according to a fifth embodiment of the present invention. The CPP structure magnetoresistive read element 35d allows disposition of the rear ends of the domain controlling films 45 at positions rearward from the rear end of the magnetoresistive film 44. Here, the distance between the rear end of the magnetoresistive film 44 and the air bearing surface 29 is set at approximately half the distance between the rear ends of the domain controlling films 45 and the air bearing surface 29. The second region 45b can be located at the intermediate position in the longitudinal direction perpendicular to the air bearing surface 29. The domain controlling films 45 have a uniform thickness. The magnetoresistive film 44 exhibits a stronger biasing magnetic field at the intermediate position in the longitudinal direction rather than the front end exposed at the air bearing surface 29, as the inventors has demonstrated. Accordingly, the second biasing magnetic field of the second intensity larger than the first intensity of the first region 45a can be established at the rear end of the magnetoresistive film 44, as shown in FIG. 17.

Figure 18:
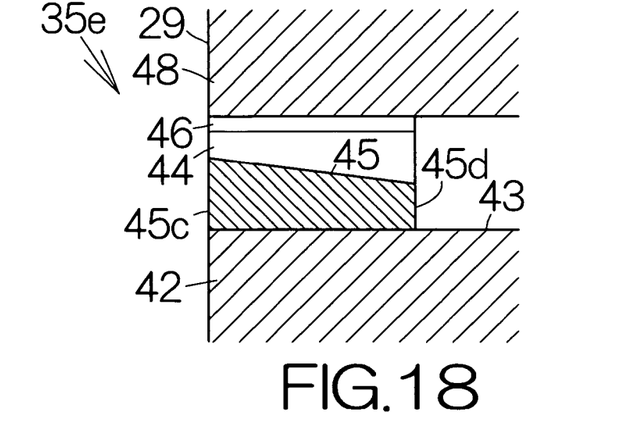
FIG. 18 is an enlarged partial sectional view, corresponding to FIG. 5, for illustrating a portion of a CPP structure magnetoresistive read element according to a sixth embodiment of the present invention.

FIG. 18 schematically illustrates the structure of a CPP structure magnetoresistive read element 35e according to a sixth embodiment of the present invention. The CPP structure magnetoresistive read element 35e allows establishment of first and second regions 45c, 45d in the domain controlling films 45. The second region 45d has a thickness smaller than that of the first region 45c. Here, the thickness of the domain controlling films 45 may be decreased at a location closer to the rear end. Specifically, an inclined surface may be formed on the surface of the domain controlling films 45 relative to the flattened surface 43.

Figure 19:
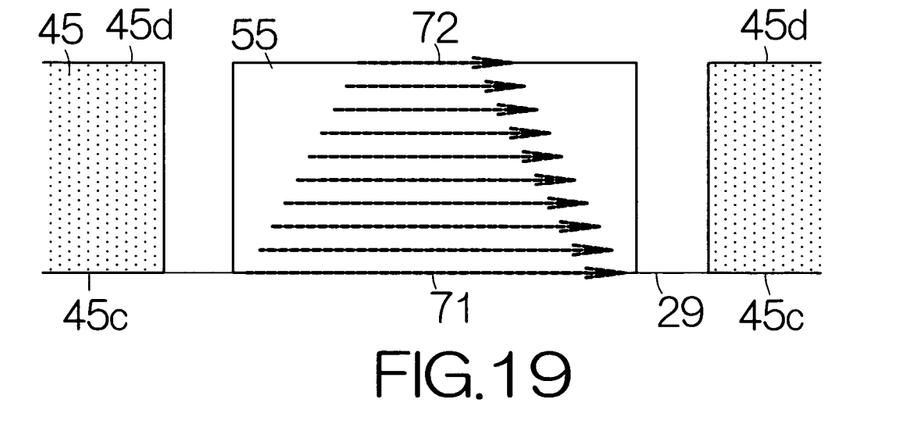
FIG. 19 is an enlarged partial sectional view, corresponding to FIG. 6, for illustrating a portion of the CPP structure magnetoresistive read element according to the sixth embodiment.

As shown in FIG. 19, the first regions 45c serve to establish a first biasing magnetic field 71 of a first intensity across the magnetoresistive film 44 along the front end of the magnetoresistive film 44. The second regions 45d serve to establish a second biasing magnetic field 72 of a second intensity across the magnetoresistive film 44 along the rear end of the magnetoresistive film 44. Here, the second intensity is set smaller than the first intensity. The intensity of the biasing magnetic filed at a position between the first and second regions 45c, 45d may be set at a predetermined level in a range between the first and second intensity.

Figure 20:
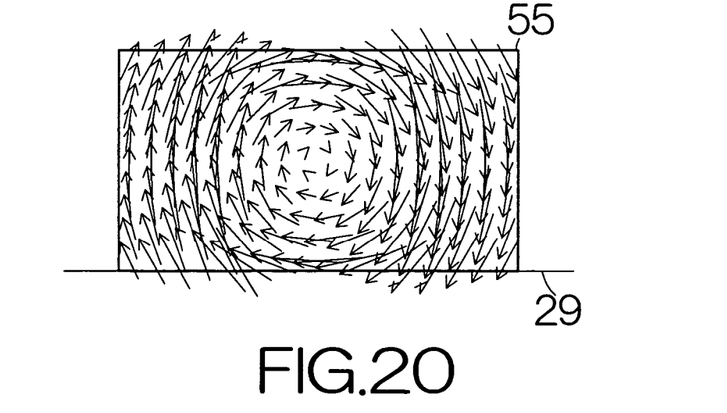
FIG. 20 is a schematic view illustrating the direction of the magnetization induced based on a sensing current in a free magnetic layer.

Now, assume that a sensing current flows across the magnetoresistive film 44. When the sensing current is supplied to the magnetoresistive film 44 through the upper electrode 48, for example, an annular magnetic field, namely a current field is induced in the free magnetic layer 55, as shown in FIG. 20. The current field circulates within a horizontal plane perpendicular to the flow of the sensing current around the centerline of the flow. The current field exhibits a stronger magnetic field at a remoter location from the centerline of the flow within the horizontal plane. In addition, the larger the current value of the sensing current gets, the stronger the current field becomes.

In this case, the first biasing magnetic field 71 is opposed to the current field at a position near the front end of the free magnetic layer 55. The first biasing magnetic field 71 overcomes the current field, so that the single domain property is established within the free magnetic layer 55 in a direction along the air bearing surface 29. On the other hand, the second biasing magnetic field 72 acts in the same direction as the current field at a position near the rear end. The magnetization is allowed to reliably rotate within the free magnetic layer 55 in response to the inversion of the magnetic flux acting on the magnetoresistive film 44 from the magnetic recording disk 13. the CPP structure magnetoresistive read element 35e enables supply of the sensing current having a larger current value to the magnetoresistive film 44. Moreover, the magnetoresistive film 44 is allowed to maintain a sufficient sensitivity.

Figure 21:
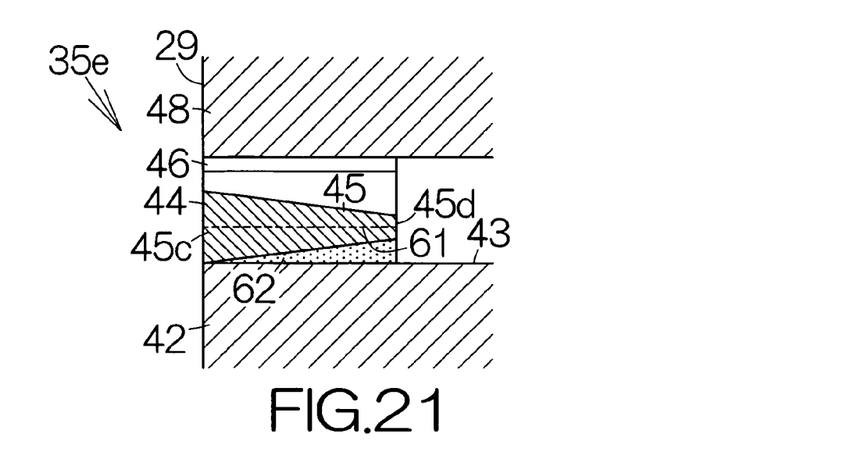
FIG. 21 is an enlarged partial sectional view, corresponding to FIG. 5, for illustrating a portion of a CPP structure magnetoresistive read element according to a modified sixth embodiment.

As shown in FIG. 21, the CPP structure magnetoresistive read element 35e may allow formation of the domain controlling films 45 symmetric relative to the plane 61 extending in parallel with the flattened surface 43 in the same manner as described above. The domain controlling films 45 may be received on the non-magnetic layer 62 extending on the flattened surface 43.

Figure 22:
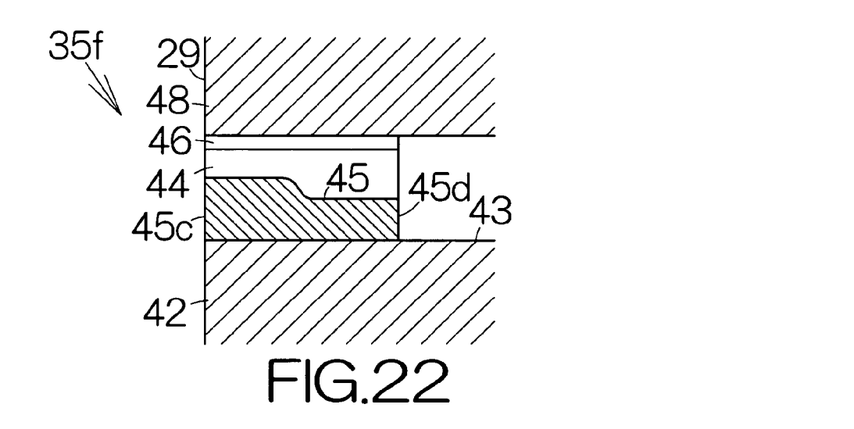
FIG. 22 is an enlarged partial sectional view, corresponding to FIG. 5, for illustrating a portion of a CPP structure magnetoresistive read element according to a seventh embodiment of the present invention.

As shown in FIG. 22, the CPP structure magnetoresistive read element 35f allows establishment of first and second regions 45c, 45d in the domain controlling films 45, for example. The first region 45c has a first thickness while the second region 45d has a second thickness smaller than the first thickness. The first and second regions 45c, 45d have surfaces in parallel with the flattened surface 43. A step may be defined between the upper surfaces of the first and second regions 45c, 45d.

Figure 23:
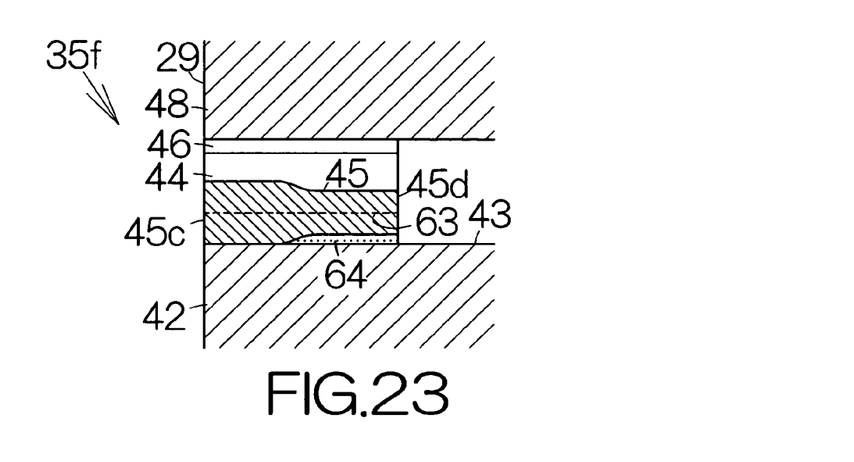
FIG. 23 is an enlarged partial sectional view, corresponding to FIG. 5, for illustrating a portion of a CPP structure magnetoresistive read element according to a modified seventh embodiment.

As shown in FIG. 23, the domain controlling films 45 may be formed symmetric relative to the plane 63 extending in parallel with the flattened surface 43, for example. Here, the domain controlling films 45 may be received on the non-magnetic layer 64 extending on the flattened surface 43. A step is defined between the upper surfaces of the first and second regions 45c, 45d.

Figure 24:
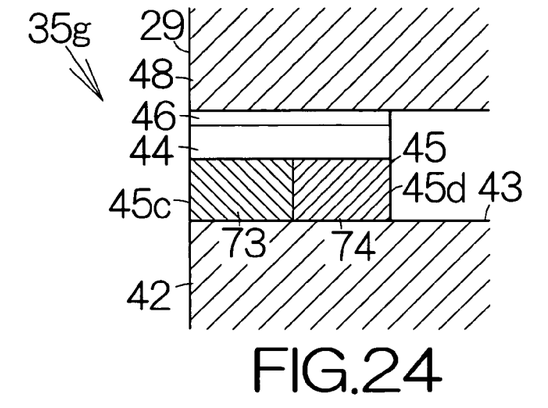
FIG. 24 is an enlarged partial sectional view, corresponding to FIG. 5, for illustrating a portion of a CPP structure magnetoresistive read element according to an eighth embodiment of the present invention.

As shown in FIG. 24, the CPP structure magnetoresistive read element 35g includes a front film 73 extending rearward from the air bearing surface 29 and a rear film 74 extending rearward from the rear end of the front film 73. The front film 73 is made of a material of a first composition having a first residual magnetic flux density. The front film 73 corresponds to the first region 45c. The rear film 74 is made of a material of a second composition having a second residual magnetic flux density smaller than the first residual magnetic flux density. The rear film 74 corresponds to the second region 45d.

Figure 25:
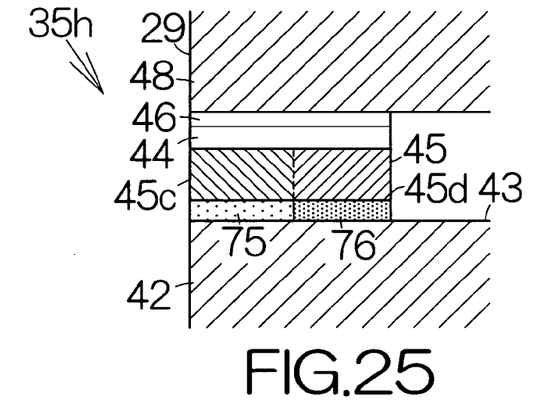
FIG. 25 is an enlarged partial sectional view, corresponding to FIG. 5, for illustrating a portion of a CPP structure magnetoresistive read element according to a ninth embodiment of the present invention.

As shown in FIG. 25, a CPP structure magnetoresistive read element 35h includes a first underlayer 75 receiving the first region 45c and a second underlayer 76 receiving the second region 45d, for example. The first underlayer 75 serves to control the size and orientation of the crystal grains in the first region 45c. The intensity of the residual magnetic flux density can be controlled in the first region 45c based on the influence from the first underlayer 75. Likewise, the second underlayer 76 serves to control the size and orientation of the crystal grains in the second region 45d. The intensity of the residual magnetic flux density can be controlled in the second region 45d based on the influence from the second underlayer 76. It should be noted that the size of the crystal grains in the second region 45d is set larger than that of the crystal grains in the first region 45c.

Figure 26:
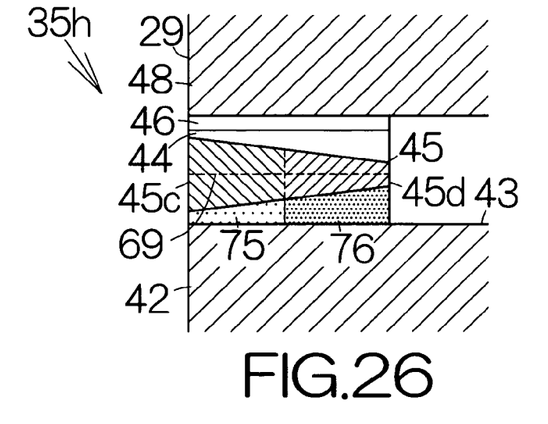
FIG. 26 is an enlarged partial sectional view, corresponding to FIG. 5, for illustrating a portion of a CPP structure magnetoresistive read element according to a modified ninth embodiment.

AS shown in FIG. 26, the CPP structure magnetoresistive read element 35h may allow formation of the domain controlling films 45 symmetric relative to the plane 69 extending in parallel with the flattened surface 43, for example. The domain controlling films 45 of the type may be received on the first and second underlayers 75, 76, respectively, in the aforementioned manner. Inclined surfaces may be formed on the first and second underlayers 75, 76, so that the inclined surfaces get closer to the flattened surface 43 at a position remoter from the air bearing surface 29.

What is claimed is:

1. A current-perpendicular-to-the-plane structure magnetoresistive element comprising:

a magnetoresistive film extending rearward from a front end exposed at a medium-opposed surface; and domain controlling films extending rearward from front ends exposed at the medium-opposed surface, respectively, said magnetoresistive film interposed between the domain controlling films, wherein said domain controlling films respectively include:

first regions designed to establish a first biasing magnetic field of a first intensity across the magnetoresistive film along the front end of the magnetoresistive film; and second regions designed to establish a second biasing magnetic field of a second intensity larger than the first intensity across the magnetoresistive film along a rear end of the magnetoresistive film, and wherein said first regions are made of a material of a first composition having a first residual magnetic flux density while said second regions are made of a material of a second composition having a second residual magnetic flux density larger than the first residual magnetic flux density.

2. The current-perpendicular-to-the-plane structure magnetoresistive element according to claim 1, wherein said second regions of the domain controlling films have a thickness larger than that of the first regions of the domain controlling films.

3. A current-perpendicular-to-the-plane structure magnetoresistive element comprising:
a magnetoresistive film extending rearward from a front end exposed at a medium-opposed surface; and
domain controlling films extending rearward from front ends exposed at the medium-opposed surface, respectively, said magnetoresistive film interposed between the domain controlling films,
wherein said domain controlling films respectively include:
first regions designed to establish a first biasing magnetic field of a first intensity across the magnetoresistive film along the front end of the magnetoresistive film; and
second regions designed to establish a second biasing magnetic field of a second intensity larger than the first intensity across the magnetoresistive film along a rear end of the magnetoresistive film, and
said current-perpendicular-to-the-plane structure magnetoresistive element further includes:
a first underlayer or underlayers receiving the first regions of the domain controlling films, said first underlayer or underlayers designed to control size of crystal grains in the first regions; and
a second underlayer or underlayers receiving the second regions of the domain controlling films, said second underlayer or underlayers designed to control size of crystal grains in the second regions.

4. The current-perpendicular-to-the-plane structure magnetoresistive element according to claim 3, wherein said second regions of the domain controlling films have a thickness larger than that of the first regions of the domain controlling films.

5. A head slider comprising:
a slider body opposing a medium-opposed surface to a recording medium;
a magnetoresistive film extending rearward from a front end exposed at the medium-opposed surface; and
domain controlling films extending rearward from front ends exposed at the medium-opposed surface, respectively, said magnetoresistive film interposed between the domain controlling films,
wherein said domain controlling films respectively include:
first regions designed to establish a first biasing magnetic field of a first intensity across the magnetoresistive film along the front end of the magnetoresistive film; and
second regions designed to establish a second biasing magnetic field of a second intensity larger than the first intensity across the magnetoresistive film along a rear end of the magnetoresistive film, and
wherein said first regions are made of a material of a first composition having a first residual magnetic flux density while said second regions are made of a material of a second composition having a second residual magnetic flux density larger than the first residual magnetic flux density.

6. The head slider according to claim 5, wherein said second regions of the domain controlling films have a thickness larger than that of the first regions of the domain controlling films.

7. A head slider comprising:
a slider body opposing a medium-opposed surface to a recording medium;
a magnetoresistive film extending rearward from a front end exposed at a medium-opposed surface; and
domain controlling films extending rearward from front ends exposed at the medium-opposed surface, respectively, said magnetoresistive film interposed between the domain controlling films, wherein
said domain controlling film respectively include:
first regions designed to establish a first biasing magnetic field of a first intensity across the magnetoresistive film along the front end of the magnetoresistive film; and
second regions designed to establish a second biasing magnetic field of a second intensity larger than the first intensity across the magnetoresistive film along a rear end of the magnetoresistive film, and
wherein said current-perpendicular-to-the-plane structure magnetoresistive element further includes:
a first underlayer or underlayers receiving the first regions of the domain controlling films, said first underlayer or underlayers designed to control size of crystal grains in the first regions; and
a second underlayer or underlayers receiving the second regions of the domain controlling films, said second underlayer or underlayers designed to control size of crystal grains in the second regions.

8. The head slider according to claim 7, wherein said second regions of the domain controlling film shave a thickness larger than that of the first regions of the domain controlling films.

* * * * *

UNITED STATES PATENT AND TRADEMARK OFFICE
CERTIFICATE OF CORRECTION

PATENT NO. : 7,355,825 B2  Page 1 of 1
APPLICATION NO. : 11/072571
DATED : April 8, 2008
INVENTOR(S) : Oshima

It is certified that error appears in the above-identified patent and that said Letters Patent is hereby corrected as shown below:

In the Claims:

Col. 16, line 45, delete "shave" and insert --have--.

Signed and Sealed this

Fifth Day of August, 2008

JON W. DUDAS
*Director of the United States Patent and Trademark Office*